US012772679B2

(12) United States Patent
Choi et al.

(10) Patent No.: US 12,772,679 B2
(45) Date of Patent: Oct. 20, 2026

(54) DISPLAY APPARATUS HAVING CONNECTION MEMBER CONNECTING DRIVING VOLTAGE LINE AND DRIVING SEMICONDUCTOR LAYER

(71) Applicant: Samsung Display Co., Ltd., Yongin-si (KR)

(72) Inventors: Seungjoo Choi, Yongin-si (KR); Moonkeun Choi, Yongin-si (KR); Kyunghoon Park, Yongin-si (KR); Hyunmin Lee, Yongin-si (KR); Kyuhyeok Im, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 797 days.

(21) Appl. No.: 17/965,626

(22) Filed: Oct. 13, 2022

(65) Prior Publication Data

US 2023/0131822 A1 Apr. 27, 2023

(30) Foreign Application Priority Data

Oct. 21, 2021 (KR) ........................ 10-2021-0141362

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC .. H10K 59/1315; H10K 59/123; H10K 71/00; H10K 59/1201; H10K 2102/351;
(Continued)

(56) References Cited

U.S. PATENT DOCUMENTS 9,117,407 B2 8/2015 Kim
10,461,141 B2 10/2019 Choi
(Continued)

FOREIGN PATENT DOCUMENTS

KR 10-2017-0006321 A 1/2017
KR 10-1951665 B1 2/2019
(Continued)

*Primary Examiner* — Caleb E Henry
*Assistant Examiner* — Pratiksha Jayant Lohakare
(74) *Attorney, Agent, or Firm* — Womble Bond Dickinson (US) LLP

(57) ABSTRACT

A display apparatus includes: a substrate; a driving voltage line on the substrate and extending in a first direction; a first conductive layer on a same layer as the driving voltage line and spaced apart from the driving voltage line; a first insulating layer covering the driving voltage line and the first conductive layer; a driving transistor on the first insulating layer and comprising a driving gate electrode and a driving semiconductor layer overlapping the first conductive layer; and a connection member electrically connecting the driving voltage line and the driving semiconductor layer to each other, wherein an edge of the driving semiconductor layer is in contact with or inside an edge of the first conductive layer in a plan view.

19 Claims, 14 Drawing Sheets

(52) U.S. Cl.
CPC ............... *G09G 2300/0819* (2013.01); *G09G 2300/0842* (2013.01)

(58) Field of Classification Search
CPC .. H10K 59/131; H10K 59/121; H10H 29/142; H10D 86/40; H10D 86/60
USPC ............................................................ 257/71
See application file for complete search history.

(56) References Cited

U.S. PATENT DOCUMENTS

| | | | | |
|---|---|---|---|---|
| 10,790,344 | B2 | 9/2020 | Kim | |
| 11,367,756 | B2 | 6/2022 | Jo et al. | |
| 11,893,940 | B2 | 2/2024 | Jo et al. | |
| 2008/0252203 | A1* | 10/2008 | Lee | H10K 59/131 313/504 |
| 2009/0268145 | A1* | 10/2009 | Anjo | H10D 86/421 349/147 |
| 2010/0123846 | A1* | 5/2010 | Kim | G02F 1/1345 349/147 |
| 2014/0158995 | A1* | 6/2014 | Park | H10K 59/1213 257/40 |
| 2016/0322448 | A1* | 11/2016 | Kim | H10D 30/0321 |
| 2018/0062102 | A1* | 3/2018 | Kim | H10K 59/124 |
| 2019/0197965 | A1* | 6/2019 | Park | G09G 3/3225 |
| 2021/0104578 | A1* | 4/2021 | Jo | H10K 50/115 |
| 2021/0202670 | A1* | 7/2021 | Koh | H10K 59/131 |
| 2021/0265449 | A1 | 8/2021 | Son et al. | |
| 2021/0287606 | A1* | 9/2021 | Jo | G09G 3/3233 |

FOREIGN PATENT DOCUMENTS

| | | | |
|---|---|---|---|
| KR | 10-2019-0048390 | A | 5/2019 |
| KR | 10-2019-0068190 | A | 6/2019 |
| KR | 10-2021-0042216 | A | 4/2021 |
| KR | 10-2021-0108536 | A | 9/2021 |
| KR | 10-2021-0116760 | A | 9/2021 |

* cited by examiner

DISPLAY APPARATUS HAVING CONNECTION MEMBER CONNECTING DRIVING VOLTAGE LINE AND DRIVING SEMICONDUCTOR LAYER

CROSS-REFERENCE TO RELATED APPLICATION

The present application claims priority to and the benefit of Korean Patent Application No. 10-2021-0141362, filed on Oct. 21, 2021, in the Korean Intellectual Property Office, the entire disclosure of which is incorporated herein by reference.

BACKGROUND

1. Field

Aspects of one or more embodiments relate to a display apparatus.

2. Description of the Related Art

As the field of displays visually representing various types of electrical signal information has rapidly developed, various display apparatuses having excellent characteristics such as thinness, light weight, and low power consumption have been introduced.

Display apparatus include various categories or technologies including, for example, liquid crystal display apparatuses using light of a backlight without self emission of light, or light-emitting display apparatuses including display elements capable of self-emitting light. A light-emitting display apparatus may include display elements including an emission layer.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a structure of a light-emitting display apparatus.

Additional aspects will be set forth in part in the description which follows and, in part, will be apparent from the description, or may be learned by practice of the presented embodiments of the disclosure.

According to one or more embodiments, a display apparatus includes a substrate, a driving voltage line arranged on the substrate and extending in a first direction, a first conductive layer arranged on the same layer as the driving voltage line and spaced apart from the driving voltage line, a first insulating layer covering the driving voltage line and the first conductive layer, a driving transistor arranged on the first insulating layer and including a driving gate electrode and a driving semiconductor layer overlapping the first conductive layer, and a connection member electrically connecting the driving voltage line and the driving semiconductor layer to each other, wherein an edge of the driving semiconductor layer is in contact with or arranged inside an edge of the first conductive layer in a plan view.

According to some embodiments, the connection member may be arranged on the same layer as the driving gate electrode.

According to some embodiments, the display apparatus may further include a capacitor electrically connected to the driving transistor, wherein the capacitor may include a first capacitor electrode, a second capacitor electrode arranged above the first capacitor electrode and overlapping the first capacitor electrode, and a third capacitor electrode arranged below the first capacitor electrode and overlapping the first capacitor electrode, wherein the third capacitor electrode may be the first conductive layer.

According to some embodiments, the connection member may be arranged on the same layer as the second capacitor electrode.

According to some embodiments, the first capacitor electrode may be integral with the driving gate electrode.

According to some embodiments, the first conductive layer may be connected to the second capacitor electrode via a contact hole.

According to some embodiments, the connection member may be arranged above the driving voltage line and may include a first portion overlapping the driving voltage line and a second portion protruding from the first portion, wherein a first length of the first portion in the first direction may be greater than a second length of the second portion in the first direction.

According to some embodiments, the display apparatus may further include a sub-line arranged above the driving voltage line and overlapping the driving voltage line, wherein the connection member may be arranged above the driving voltage line and the sub-line and may include a first portion overlapping the driving voltage line and a second portion protruding from the first portion, wherein a first length of the first portion in the first direction may be greater than a second length of the second portion in the first direction.

According to some embodiments, the connection member may be connected to the driving voltage line via a contact hole.

According to some embodiments, the driving gate electrode may include a shape protruding in the first direction or a second direction along a channel region of the driving semiconductor layer in a plan view.

According to one or more embodiments, a display apparatus includes a substrate, adjacent common voltage lines spaced apart from each other on the substrate and extending in a first direction, a driving voltage line arranged between the adjacent common voltage lines and extending in the first direction, adjacent auxiliary lines electrically connected to the adjacent common voltage lines or the driving voltage line, spaced apart from each other, and extending in a second direction crossing the first direction, and a plurality of pixel circuits arranged in an area surrounded by the adjacent common voltage lines and the adjacent auxiliary lines in a plan view, wherein a first pixel circuit from among the plurality of pixel circuits includes a first conductive layer arranged on the same layer as the driving voltage line and spaced apart from the driving voltage line, a first driving transistor insulated from the first conductive layer and including a first driving gate electrode and a first driving semiconductor layer overlapping the first conductive layer, and a connection member electrically connecting the driving voltage line and the first driving semiconductor layer to each other, wherein an edge of the first driving semiconductor layer is in contact with or arranged inside an edge of the first conductive layer in a plan view.

According to some embodiments, the display apparatus may further include a data line arranged between the adjacent common voltage lines and extending in the first direction, wherein the first pixel circuit may further include a first switching transistor electrically connected to the first driving transistor and the data line.

According to some embodiments, the display apparatus may further include a sensing line arranged between the adjacent common voltage lines and extending in the first direction, wherein the first pixel circuit may further include a first sensing transistor electrically connected to the first driving transistor and the sensing line.

According to some embodiments, the display apparatus may further include a capacitor electrically connected to the first driving transistor, wherein the capacitor may include a first capacitor electrode, a second capacitor electrode arranged above the first capacitor electrode and overlapping the first capacitor electrode, and a third capacitor electrode arranged below the first capacitor electrode and overlapping the first capacitor electrode, wherein the third capacitor electrode may be the first conductive layer.

According to some embodiments, the connection member may be arranged on the same layer as the second capacitor electrode.

According to some embodiments, the first capacitor electrode may be integral with the first driving gate electrode.

According to some embodiments, the first conductive layer may be connected to the second capacitor electrode via a contact hole.

According to some embodiments, the connection member may be arranged above the driving voltage line and may include a first portion overlapping the driving voltage line and a second portion protruding from the first portion, wherein a first length of the first portion in the first direction may be greater than a second length of the second portion in the first direction.

According to some embodiments, the display apparatus may further include a sub-line arranged above the driving voltage line and overlapping the driving voltage line, wherein the connection member may be arranged above the driving voltage line and the sub-line and may include a first portion overlapping the driving voltage line and a second portion protruding from the first portion, wherein a first length of the first portion in the first direction may be greater than a second length of the second portion in the first direction.

According to some embodiments, the connection member may be connected to the driving voltage line via a contact hole.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1A:
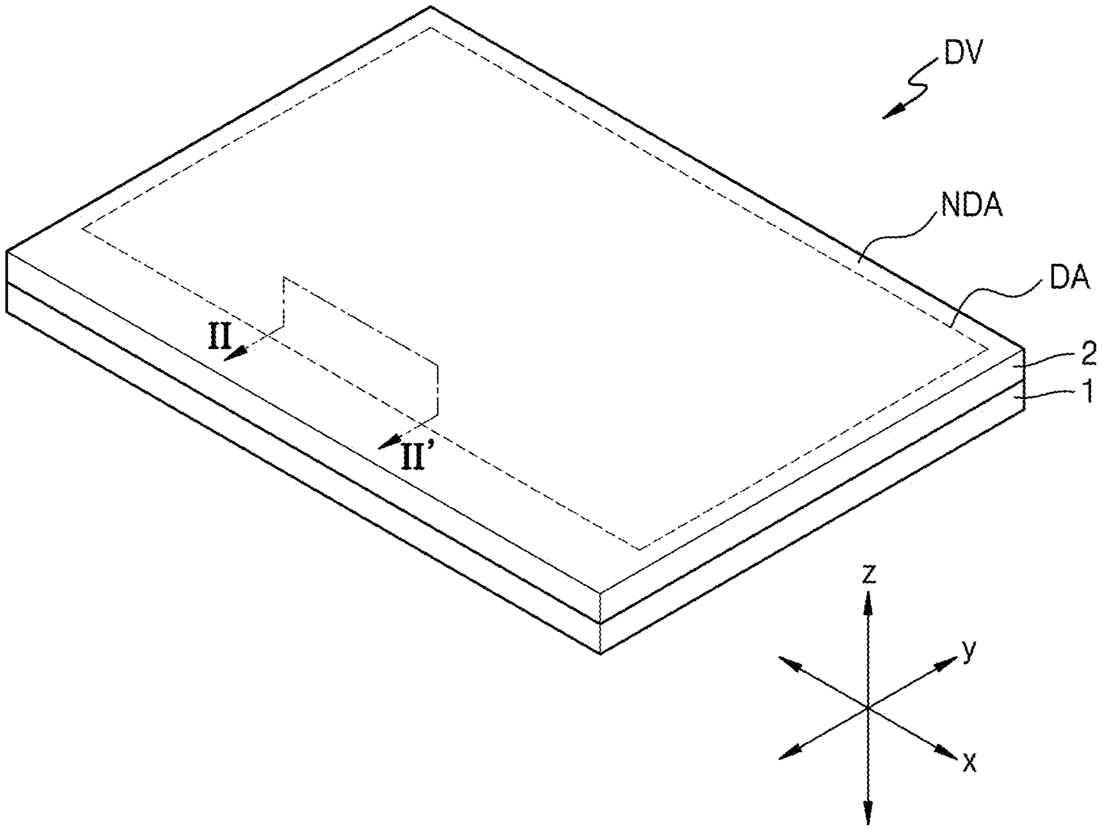
FIG. 1A is a schematic perspective view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

Aspects of one or more embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of explanation. For example, because sizes and thicknesses of elements in the drawings are arbitrarily illustrated for convenience of explanation, the following embodiments are not limited thereto.

When an embodiment may be implemented differently, a certain process order may be performed differently from the described order. For example, two consecutively described processes may be performed substantially at the same time or performed in an order opposite to the described order.

It will be further understood that, when layers, regions, or elements are referred to as being connected to each other, they may be directly connected to each other or may be indirectly connected to each other with intervening layers, regions, or elements therebetween. For example, when layers, regions, or elements are referred to as being electrically connected to each other, they may be directly electrically connected to each other or may be indirectly electrically connected to each other with intervening layers, regions, or elements therebetween.

Figure 1B:
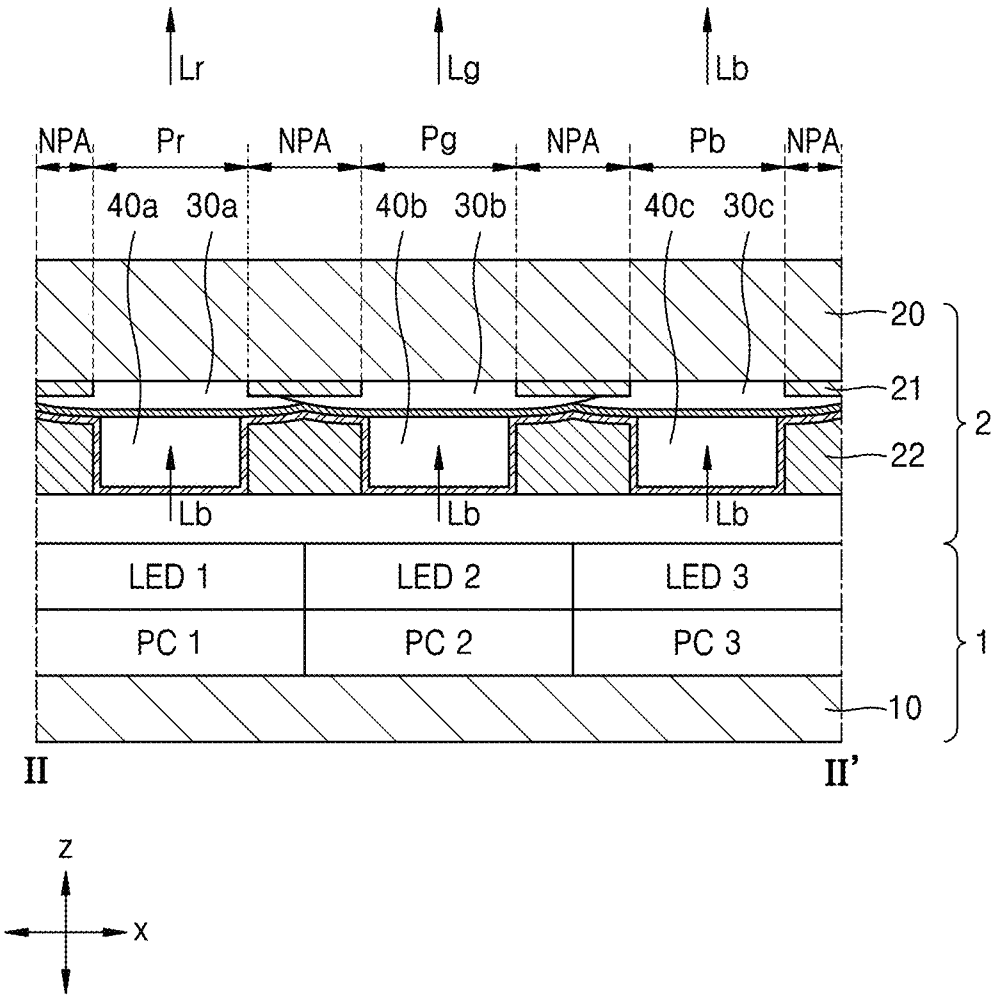
FIG. 1B is a cross-sectional view of a display apparatus according to some embodiments, taken along the line II-II' of FIG. 1A.
Figure 1C:
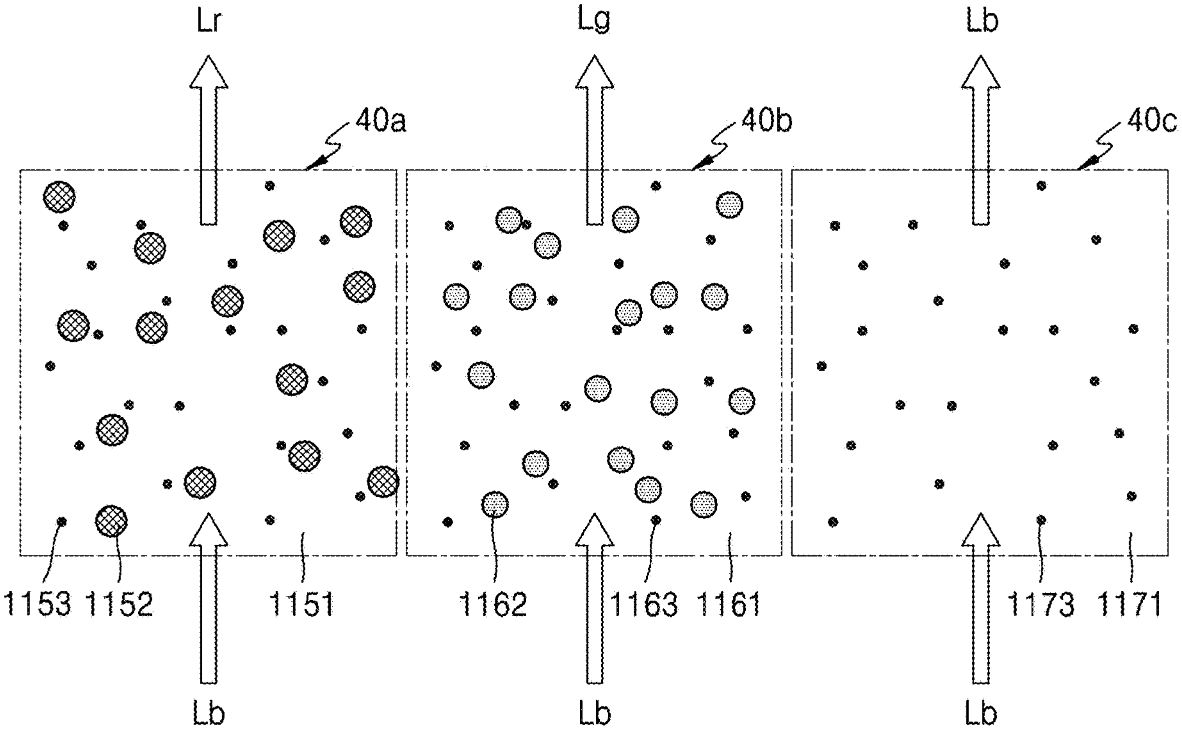
FIG. 1C shows each portion of a color conversion-transmission layer of FIG. 1B.

FIG. 1A is a schematic perspective view of a display apparatus DV according to some embodiments. FIG. 1B is a cross-sectional view of a display apparatus according to some embodiments, taken along the line II-II' of FIG. 1A. FIG. 1C shows each portion of a color conversion-transmission layer of FIG. 1B.

Referring to FIG. 1A, the display apparatus DV may include a display area DA and a non-display area NDA outside (e.g., outside a periphery or footprint, in a plan view) the display area DA. The display apparatus DV may display images through an array of a plurality of pixels two-dimensionally arranged in the display area DA.

Each pixel of the display apparatus DV is an area where light of a certain color may be emitted, and the display apparatus DV may provide an image by using light emitted from pixels. For example, each pixel may emit red, green, or blue light.

The non-display area NDA is an area where no images are displayed and may entirely surround the display area DA. A driver or a main power line for providing an electrical signal or power to pixel circuits may be arranged in the non-display area NDA. The non-display area NDA may include a pad, which is an area to which an electronic device or a printed circuit board may be electrically connected.

As shown in FIG. 1A, the display area DA may have a polygonal shape including a quadrilateral shape. For example, the display area DA may have a rectangular shape having a horizontal length greater than a vertical length, a rectangular shape having a horizontal length less than a vertical length, or a square shape. Alternatively, the display area DA may have various shapes such as an oval shape or a circular shape.

Referring to FIG. 1B, the display apparatus may include a light-emitting panel 1 and a color panel 2 stacked in a thickness direction (e.g., a direction z). The light-emitting panel 1 may include first to third pixel circuits PC1 to PC3 on a first substrate 10, and first to third light-emitting diodes LED1 to LED3 respectively connected thereto.

While passing through the color panel 2, light (e.g., blue light Lb) emitted from the first to third light-emitting diodes LED1 to LED3 may be converted into red light Lr, green light Lg, and blue light Lb or may be transmitted. An area where the red light Lr is emitted may correspond to a red pixel Pr, an area where the green light Lg is emitted may correspond to a green pixel Pg, and an area where the blue light Lb is emitted may correspond to a blue pixel Pb.

The color panel 2 may include a second substrate 20 and a first light-blocking layer 21 on the second substrate 20. The first light-blocking layer 21 may include a plurality of holes formed by removing portions corresponding to the red pixel Pr, the green pixel Pg, and the blue pixel Pg. The first light-blocking layer 21 may include a material portion located in a non-pixel area NPA, and the material portion may include various materials capable of absorbing light.

A second light-blocking layer 22 may be arranged on the first light-blocking layer 21. The second light-blocking layer 22 may also include a material portion located in the non-pixel area NPA. The second light-blocking layer 22 may include various materials capable of absorbing light. The second light-blocking layer 22 may include the same material as the first light-blocking layer 21 described above, or may include a different material from the first light-blocking layer 21.

The first light-blocking layer 21 and/or the second light-blocking layer 22 may include an opaque inorganic insulating material such as chromium oxide or molybdenum oxide, or an opaque organic insulating material such as black resin.

A color layer including first to third color filters 30*a* to 30*c* may be arranged on the second substrate 20. The first color filter 30*a* may include pigment or dye of a first color (e.g., red). The second color filter 30*b* may include pigment or dye of a second color (e.g., green). The third color filter 30*c* may include pigment or dye of a third color (e.g., blue).

A color conversion-transmission layer including a first color-converting portion 40*a*, a second color-converting portion 40*b*, and a transmission portion 40*c* may be arranged between the color layer and light-emitting diodes.

The first color-converting portion 40*a* may overlap the first color filter 30*a* and may convert incident blue light Lb into red light Lr. As shown in FIG. 1C, the first color-converting portion 40*a* may include a first photosensitive polymer 1151, and first quantum dots 1152 and first scattering particles 1153 dispersed in the first photosensitive polymer 1151.

The first quantum dots 1152 may be excited by the blue light Lb to isotropically emit the red light Lr having a wavelength longer than a wavelength of the blue light Lb. The first photosensitive polymer 1151 may be a light-transmissive organic material.

The first scattering particles 1153 may scatter the blue light Lb that is not absorbed by the first quantum dots 1152 to allow more first quantum dots 1152 to be excited, thereby increasing color-converting efficiency. The first scattering particles 1153 may include, for example, titanium oxide ($TiO_2$) or metal particles. The first quantum dots 1152 may be selected from a group II-VI compound, a group III-V compound, a group IV-VI compound, a group IV element, a group IV compound, and a combination thereof.

The second color-converting portion 40*b* may overlap the second color filter 30*b* and may convert incident blue light Lb into green light Lg. As shown in FIG. 1C, the second color-converting portion 40*b* may include a second photosensitive polymer 1161, and second quantum dots 1162 and second scattering particles 1163 dispersed in the second photosensitive polymer 1161.

The second quantum dots 1162 may be excited by the blue light Lb to isotropically emit the green light Lg having a wavelength longer than a wavelength of the blue light Lb. The second photosensitive polymer 1161 may be a light-transmissive organic material. The second scattering particles 1163 may scatter the blue light Lb that is not absorbed by the second quantum dots 1162 to allow more second quantum dots 1162 to be excited, thereby increasing color-converting efficiency. The second scattering particles 1163 may include, for example, titanium oxide ($TiO_2$) or metal particles. The second quantum dots 1162 may be selected from a group II-VI compound, a group III-V compound, a group IV-VI compound, a group IV element, a group IV compound, and a combination thereof. The second quantum dots 1162 may include the same material as the first quantum dots 1152, and in this regard, a size of the second quantum dots 1162 may be greater than a size of the first quantum dots 1152.

The transmission portion 40*c* may transmit blue light Lb. As shown in FIG. 1C, the transmission portion 40*c* may include a third photosensitive polymer 1171 in which third scattering particles 1173 are dispersed. The third photosensitive polymer 1171 may include, for example, a light-transmissive organic material such as silicon resin, epoxy resin, etc., and may include the same material as the first and second photosensitive polymers 1151 and 1161. The third scattering particles 1173 may scatter and emit the blue light Lb and may include the same material as the first and second scattering particles 1153 and 1163.

Blue light Lb emitted from the light-emitting panel 1 may have color converted or transmitted while passing through the color conversion-transmission layer and then may have color purity improved while passing through the color layer. For example, blue light Lb emitted from the first light-emitting diode LED1 of the light-emitting panel 1 may pass through a first color area of the color panel 2. The blue light Lb may be converted and filtered into red light Lr by the color panel 2 while passing through the color panel 2. The first color area may include a stacked structure of the first color-converting portion 40*a* and the first color filter 30*a*.

Blue light Lb emitted from the second light-emitting diode LED2 of the light-emitting panel 1 may pass through a second color area of the color panel 2. The blue light Lb may be converted and filtered into green light Lg by the color panel 2 while passing through the color panel 2. The second color area may include a stacked structure of the second color-converting portion 40*b* and the second color filter 30*b*.

Blue light Lb emitted from the third light-emitting diode LED3 of the light-emitting panel 1 may pass through a third color area of the color panel 2. The blue light Lb may be transmitted and filtered by the color panel 2 while passing through the color panel 2. The third color area may include a stacked structure of the transmission portion 40*c* and the third color filter 30*c*.

The first to third light-emitting diodes LED1 to LED3 may include an organic light-emitting diode including an organic material. According to some embodiments, the first to third light-emitting diodes LED1 to LED3 may be an inorganic light-emitting diode including an inorganic material. The inorganic light-emitting diode may include a PN junction diode including inorganic semiconductor based materials. When a voltage is applied to the PN junction diode in a forward direction, holes and electrons are injected, and energy generated by the recombination of holes and electrons may be converted into light energy to emit light of a certain color. The above-described inorganic light-emitting diode may have a width of several to hundreds of micrometers or several to hundreds of nanometers. According to some embodiments, the first to third light-emitting diodes LED1 to LED3 may be a light-emitting diode including quantum dots. As described above, an emission layer of the first to third light-emitting diodes LED1 to LED3 may include an organic material, may include an inorganic material, may include quantum dots, may include an organic material and quantum dots, or may include an inorganic material and quantum dots.

A display apparatus having the above-described structure may include a mobile phone, a television, a billboard, a monitor, a tablet personal computer (PC), a notebook computer, etc.

Figure 2:
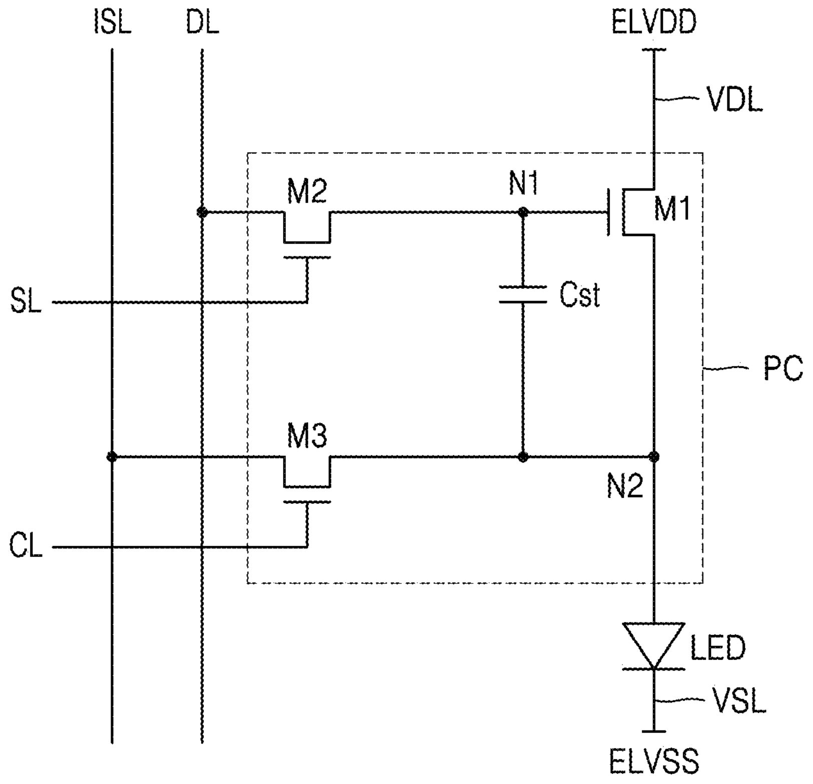
FIG. 2 is an equivalent circuit diagram showing a light-emitting diode and a pixel circuit electrically connected to the light-emitting diode, which are included in a light-emitting panel of a display apparatus according to some embodiments.

FIG. 2 is an equivalent circuit diagram showing the light-emitting diode LED and a pixel circuit PC electrically connected to the light-emitting diode LED, which are included in a light-emitting panel of a display apparatus according to some embodiments.

Referring to FIG. 2, a first electrode (e.g., an anode) of a light-emitting diode, for example, the light-emitting diode LED, may be connected to the pixel circuit PC, and a second electrode (e.g., a cathode) of the light-emitting diode LED may be connected to a common voltage line VSL configured to provide a common power voltage ELVSS. The light-emitting diode LED may emit light at a luminance corresponding to a current supplied from the pixel circuit PC.

The light-emitting diode LED of FIG. 2 may correspond to each of the first to third light-emitting diodes LED1 to LED3 shown in FIG. 1B, and the pixel circuit PC of FIG. 2 may correspond to each of first to third pixel circuits PC1 to PC3 shown in FIG. 1B.

The pixel circuit PC may control a current flowing from a driving power voltage ELVDD to the common power voltage ELVSS via the light-emitting diode LED in response to a data signal. The pixel circuit PC may include a first transistor M1, a second transistor M2, a third transistor M3, and a storage capacitor Cst.

Each of the first transistor M1, the second transistor M2, and the third transistor M3 may be an oxide semiconductor thin-film transistor including a semiconductor layer composed of an oxide semiconductor, or a silicon semiconductor thin-film transistor including a semiconductor layer composed of polysilicon. Depending on the type of a transistor, a first electrode may be one of a source electrode and a drain electrode, and a second electrode may be the other one of a source electrode and a drain electrode.

The first transistor M1 may be a driving transistor. A first electrode of the first transistor M1 may be connected to a driving voltage line VDL configured to supply the driving power voltage ELVDD, and a second electrode of the first transistor M1 may be connected to a first electrode of the light-emitting diode LED. A gate electrode of the first transistor M1 may be connected to a first node N1. The first transistor M1 may control a current flowing through the light-emitting diode LED from the driving power voltage ELVDD in response to a voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be connected to a scan line SL. When a scan signal is supplied via the scan line SL, the second transistor M2 may be turned on to electrically connect the data line DL and the first node N1 to each other.

The third transistor M3 may be an initialization transistor and/or a sensing transistor. A first electrode of the third transistor M3 may be connected to a second node N2, and a second electrode of the third transistor M3 may be connected to an initialization sensing line ISL. A gate electrode of the third transistor M3 may be connected to a control line CL.

When a control signal is supplied via the control line CL, the third transistor M3 may be turned on to electrically connect the initialization sensing line ISL and the second node N2 to each other. According to some embodiments, the third transistor M3 may be turned on according to a signal received via the control line CL to transfer an initialization voltage from the initialization sensing line ISL and initialize the first electrode of the light-emitting diode LED. According to some embodiments, when a control signal is supplied via the control line CL, the third transistor M3 may be turned on to sense characteristic information of the light-emitting diode LED. The third transistor M3 may have both of the above-described functions as an initialization transistor and a sensing transistor, or may have either function. According to some embodiments, when the third transistor M3 has a function as an initialization transistor, the initialization sensing line ISL may be referred to as an initialization voltage line, and when the third transistor M3 has a function as a sensing transistor, the initialization sensing line ISL may be referred to as a sensing line. An initialization operation and a sensing operation of the third transistor M3 may each be performed individually or may be performed simultaneously. Hereinafter, for convenience of description, a case in which a third transistor has both the functions of an initialization transistor and a sensing transistor will be described in more detail.

The storage capacitor Cst may be connected between the first node N1 and the second node N2. For example, a first capacitor electrode of the storage capacitor Cst may be connected to the gate electrode of the first transistor M1, and a second capacitor electrode of the storage capacitor Cst may be connected to the first electrode of the light-emitting diode LED.

Although the first transistor M1, the second transistor M2, and the third transistor M3 are shown as NMOS transistors in FIG. 2, embodiments according to the present disclosure are not limited thereto. For example, at least one of the first transistor M1, the second transistor M2, or the third transistor M3 may be PMOS transistors.

Although FIG. 2 shows three transistors, embodiments according to the present disclosure are not limited thereto. The pixel circuit PC may include four or more transistors.

Hereinafter, it is shown that one or more embodiments include three transistors, the first transistor M1 is a driving transistor, the second transistor M2 is a switching transistor, and the third transistor M3 is an initialization-sensing transistor.

Figure 3A:
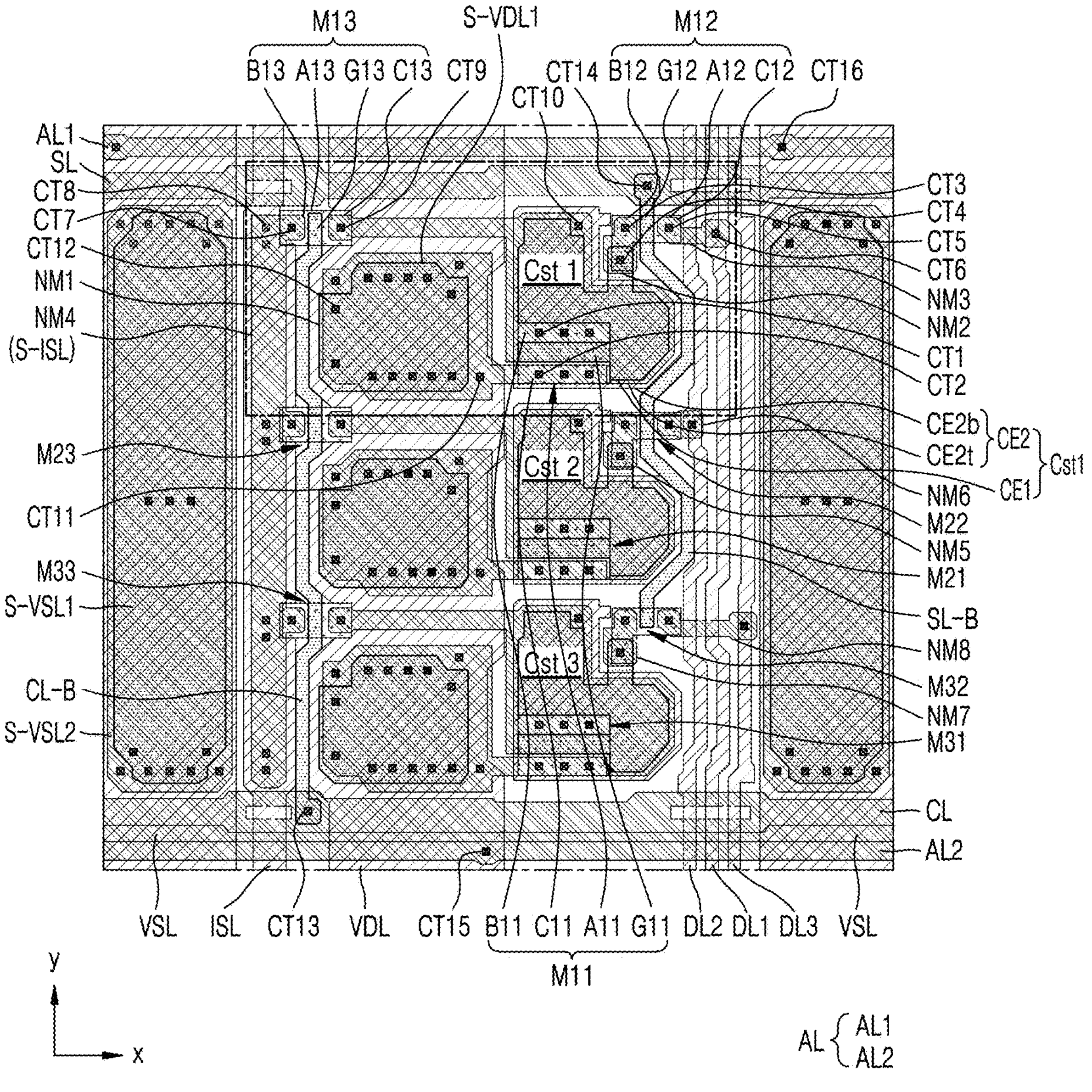
FIG. 3A is a plan view showing pixel circuits of a light-emitting panel of a display apparatus according to some embodiments.
Figure 3B:
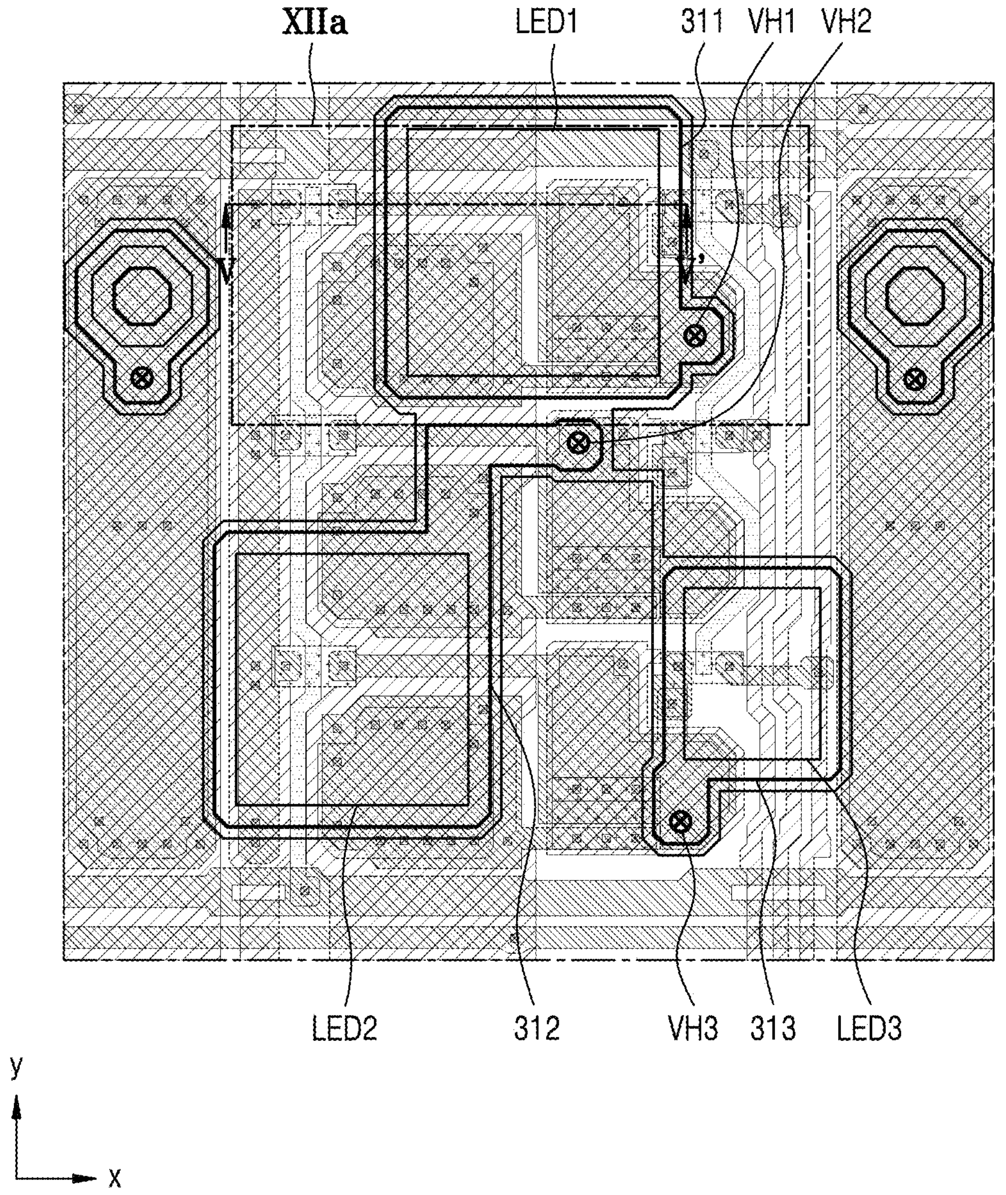
FIG. 3B is a plan view of light-emitting diodes connected to the pixel circuits of FIG. 3A.
Figure 4:
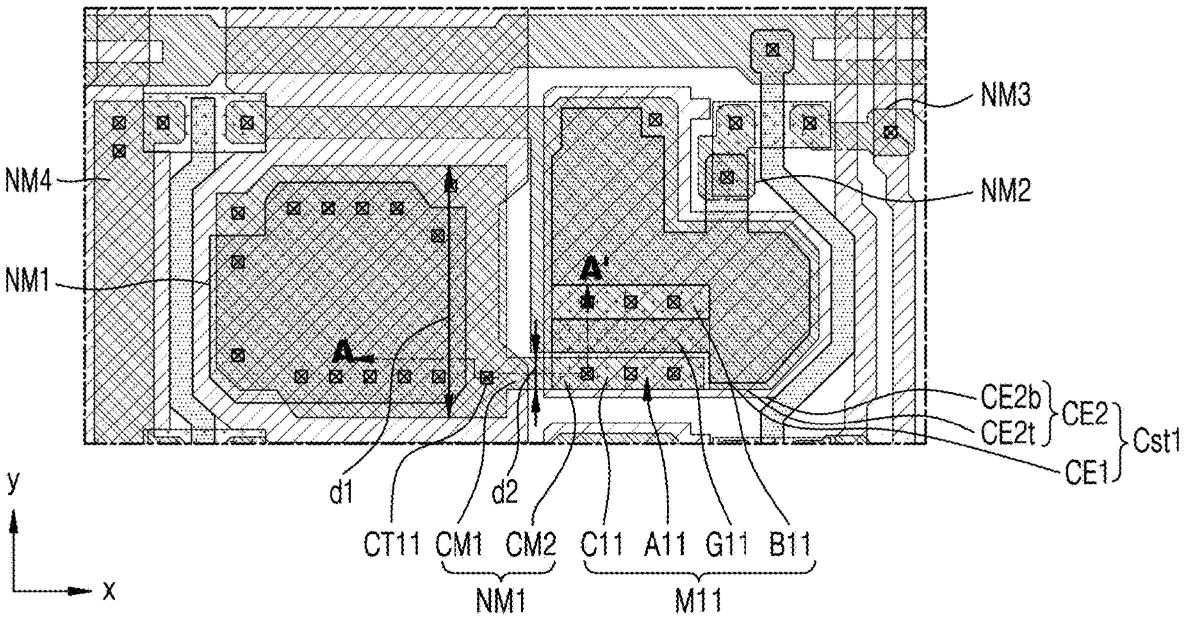
FIG. 4 is an enlarged plan view of the region XIIa of FIG. 3B.

FIG. 3A is a plan view showing pixel circuits of a light-emitting panel of a display apparatus according to some embodiments. FIG. 3B is a plan view of light-emitting diodes connected to the pixel circuits of FIG. 3A. In addition, FIG. 4 is an enlarged plan view of region XIIa of FIG. 3B. According to some embodiments, FIG. 3B shows a case in which light-emitting diodes are organic light-emitting diodes.

Referring to FIG. 3A, the common voltage line VSL, the driving voltage line VDL, and the initialization sensing line ISL may extend in a first direction y. A plurality of data lines, for example, first to third data lines DL1 to DL3 may be arranged in the first direction y. The scan line SL and the control line CL may extend in a second direction x crossing the first direction y.

Two adjacent common voltage lines VSL may be spaced apart from each other, and the first to third data lines DL1 to DL3, the initialization sensing line ISL, and the driving voltage line VDL may be arranged between the above-described two adjacent common voltage lines VSL. The initialization sensing line ISL and the driving voltage line VDL may be adjacent to one common voltage line VSL while neighboring each other. The first to third data lines DL1 to DL3 may be adjacent to the other common voltage line VSL while neighboring one another. For example, the initialization sensing line ISL and the driving voltage line VDL may be arranged on one side (e.g., a left side) of first to third storage capacitors Cst1 to Cst3 described below and the first to third data lines DL1 to DL3 may be arranged on the other side (e.g., a right side) of the first to third storage capacitors Cst1 to Cst3, and space of the display panel may be efficiently used through such a structure.

Auxiliary lines AL may extend, for example, in the second direction x, to cross the common voltage line VSL and the driving voltage line VDL. The auxiliary lines AL may be spaced apart from each other with the first to third storage capacitors Cst1 to Cst3 therebetween. According to some embodiments, a first auxiliary line AL1 may be adjacent to the scan line SL, and a second auxiliary line AL2 may be adjacent to the control line CL. The first auxiliary line AL1 may be electrically connected to the common voltage line VSL via a sixteenth contact hole CT16, and the second auxiliary line AL2 may be electrically connected to the driving voltage line VDL via a fifteenth contact hole CT15.

The display panel may include a structure in which the structure shown in FIG. 3A is repeated in the first direction y and the second direction x, and accordingly, a plurality of auxiliary lines AL and a plurality of common voltage lines VSL included in the display panel may have a mesh structure in a plan view. Likewise, the plurality of auxiliary lines AL and a plurality of driving voltage lines VDL electrically connected to each other may have a mesh structure in a plan view.

Transistors and storage capacitors may be arranged in a substantially quadrilateral space surrounded by neighboring common voltage lines VSL and neighboring auxiliary lines AL in a plan view. The above-described transistors and storage capacitors may each be electrically connected to a corresponding light-emitting diode, and in this regard, FIG. 3B shows first electrodes 311, 312, and 313 of the first to third light-emitting diodes LED1, LED2, and LED3 each being electrically connected to a corresponding pixel circuit.

The first electrode 311 of the first light-emitting diode LED1 may be electrically connected to a first pixel circuit, and the first pixel circuit may include a first driving transistor M11, a first switching transistor M12, a first initialization-sensing transistor M13, and the first storage capacitor Cst1.

The first electrode 312 of the second light-emitting diode LED2 may be electrically connected to a second pixel circuit, and the second pixel circuit may include a second driving transistor M21, a second switching transistor M22, a second initialization-sensing transistor M23, and the second storage capacitor Cst2.

The first electrode 313 of the third light-emitting diode LED3 may be electrically connected to a third pixel circuit, and the third pixel circuit may include a third driving transistor M31, a third switching transistor M32, a third initialization-sensing transistor M33, and the third storage capacitor Cst3.

The first to third storage capacitors Cst1 to Cst3 may be arranged in one direction, for example, the first direction y. The first storage capacitor Cst1 may be relatively closest to the scan line SL, the third storage capacitor Cst3 may be relatively farthest from the scan line SL (or closest to the control line CL), and the second storage capacitor Cst2 may be arranged between the first storage capacitor Cst1 and the third storage capacitor Cst3.

The first driving transistor M11 may include a first driving semiconductor layer A11 and a first driving gate electrode G11. The first driving semiconductor layer A11 may include a 1-1 low resistance region B11 and a 2-1 low resistance region C11, and a first channel region may be between the 1-1 low resistance region B11 and the 2-1 low resistance region C11. The 1-1 low resistance region B11 and the 2-1 low resistance region C11 are regions having a lower resistance than the first channel region and may be formed through an impurity doping process or a conductorization process. The first driving gate electrode G11 may overlap the first channel region of the first driving semiconductor layer A11. One of the 1-1 low resistance region B11 and the 2-1 low resistance region C11 may correspond to a source region, and the other may correspond to a drain region.

One of the 1-1 low resistance region B11 and the 2-1 low resistance region C11 of the first driving semiconductor layer A11 may be connected to the first storage capacitor Cst1, and the other may be connected to the driving voltage line VDL. For example, the 1-1 low resistance region B11 may be connected to a portion of a second capacitor electrode CE2 of the first storage capacitor Cst1 (e.g., a second sub-electrode CE2*t* of the second capacitor electrode CE2) via a first contact hole CT1. The 2-1 low resistance region C11 may be connected to a first connection member NM1 via a second contact hole CT2, and the first connection member NM1 may be connected to the driving voltage line VDL via an eleventh contact hole CT11. The 2-1 low resistance region C11 may be connected to the driving voltage line VDL via the first connection member NM1.

Referring to FIGS. 3A and 4, the first driving transistor M11 and the driving voltage line VDL are electrically connected to each other via the first connection member NM1. The first connection member NM1 may include a first portion CM1 overlapping the driving voltage line VDL and a second portion CM2 protruding from the first portion CM1 in the second direction x, and a length d1 of the first portion CM1 in the first direction y may be greater than a length d2 of the second portion CM2 in the first direction y.

Although FIGS. 3A and 4 show the second portion CM2 of the first connection member NM1 having a relatively constant length in the first direction y along the second direction x, embodiments according to the present disclosure are not limited thereto. A length of the second portion CM2 in the first direction y may be variously modified, for example, to gradually increase/decrease, increase/decrease stepwise, etc. in the second direction x.

The first driving gate electrode G11 may serve as a capacitor electrode. The first driving gate electrode G11 may be integral (or integrally formed, e.g., as a cohesive integral material or layer) with a first capacitor electrode CE1 and may correspond to a portion overlapping the first channel region of the first driving semiconductor layer A11. The first driving gate electrode G11 may have a shape protruding from the first capacitor electrode CE1 in the second direction x along the first channel region of the first driving semiconductor layer A11. The first driving gate electrode G11 may overlap the first channel region of the first driving semiconductor layer A11, and in this regard, an upper side of the first driving channel region may be the 1-1 low resistance region B11, and a lower side of the first driving channel region may correspond to the 2-1 low resistance region C11.

Lengths of the second portion CM2 of the first connection member NM1 in the first direction y and the second direction x may vary depending on shapes of the first driving gate electrode G11 and the 2-1 low resistance region C11. A length of the second portion CM2 in the first direction y may be greater than a length of the 2-1 low resistance region C11 in the first direction y, and a length of the second portion CM2 in the second direction x may be greater than a protruding length of the first driving gate electrode G11 in the second direction x.

The first switching transistor M12 may include a first switching semiconductor layer A12 and a first switching gate electrode G12. The first switching semiconductor layer A12 may include a 1-2 low resistance region B12 and a 2-2 low resistance region C12, and a second channel region may be between the 1-2 low resistance region B12 and the 2-2 low resistance region C12. The first switching gate electrode G12 may overlap the second channel region of the first switching semiconductor layer A12. The first switching gate electrode G12 may correspond to a portion of the scan line SL, for example, a portion of a branch (hereinafter referred to as a first branch SL-B) extending in a direction crossing the scan line SL.

The scan line SL may include gate electrodes of first to third switching transistors M12 to M32. For example, the scan line SL may include the first branch SL-B extending in the first direction y, and portions of the first branch SL-B may correspond to gate electrodes of the first to third switching transistors M12 to M32.

One of the 1-2 low resistance region B12 and the 2-2 low resistance region C12 of the first switching semiconductor layer A12 may be electrically connected to the first data line DL1, and the other may be electrically connected to the first storage capacitor Cst1. For example, the 1-2 low resistance region B12 may be connected to a second connection member NM2 via a third contact hole CT3, and the second connection member NM2 may be connected to the first capacitor electrode CE1 of the first storage capacitor Cst1 via a fourth contact hole CT4. Accordingly, the 1-2 low resistance region B12 may be connected to the first capacitor electrode CE1 of the first storage capacitor Cst1 by the second connection member NM2. The 2-2 low resistance region C12 may be connected to a third connection member NM3 via a fifth contact hole CT5, and the third connection member NM3 may be connected to the first data line DL1 via a sixth contact hole CT6. The 2-2 low resistance region C12 may be connected to the first data line DL1 by the third connection member NM3.

The first initialization-sensing transistor M13 may include a first initialization-sensing semiconductor layer A13 and a first initialization-sensing gate electrode G13. The first initialization-sensing semiconductor layer A13 may include a 1-3 low resistance region B13 and a 2-3 low resistance region C13, and a third channel region may be between the 1-3 low resistance region B13 and the 2-3 low resistance region C13. The first initialization-sensing gate electrode G13 may overlap the third channel region of the first initialization-sensing semiconductor layer A13.

The control line CL may include gate electrodes of first to third initialization-sensing transistors M13 to M33. For example, the control line CL may include a branch (hereinafter referred to as a second branch CL-B) extending in the first direction y, and portions of the second branch CL-B may correspond to gate electrodes of the first to third initialization-sensing transistors M13 to M33. The second branch CL-B may extend between the driving voltage line VDL and the initialization sensing line ISL.

One of the 1-3 low resistance region B13 and the 2-3 low resistance region C13 of the first initialization-sensing semiconductor layer A13 may be electrically connected to the initialization sensing line ISL, and the other may be electrically connected to the first storage capacitor Cst1. For example, the 1-3 low resistance region B13 may be connected to a fourth connection member NM4 via a seventh contact hole CT7, and the fourth connection member NM4 may be connected to the initialization sensing line ISL via an eighth contact hole CTB. Accordingly, the 1-3 low resistance region B13 may be electrically connected to the initialization sensing line ISL via the fourth connection member NM4. The 2-3 low resistance region C13 may be electrically connected to a portion of the second capacitor electrode CE2 of the first storage capacitor Cst1, for example, the second sub-electrode CE2*t* of the second capacitor electrode CE2, via a ninth contact hole CT9.

The first storage capacitor Cst1 may include at least two electrodes. According to some embodiments, the first storage capacitor Cst1 may include the first capacitor electrode CE1 and the second capacitor electrode CE2.

The first capacitor electrode CE1 may be integral (or integrally formed, e.g., as a cohesive integral material or layer) with the first driving gate electrode G11. In other words, the first capacitor electrode CE1 may include the first driving gate electrode G11. Alternatively, the first driving gate electrode G11 may include the first capacitor electrode CE1.

The second capacitor electrode CE2 may include a first sub-electrode CE2*b* arranged below the first capacitor electrode CE1 and the second sub-electrode CE2*t* arranged above the first capacitor electrode CE1. The first sub-electrode CE2*b* and the second sub-electrode CE2*t* may be connected to each other via a tenth contact hole CT10.

As shown in FIG. 3B, the first light-emitting diode LED1 may be electrically connected to the first pixel circuit via a first via hole VH1. For example, the first electrode 311 of the first light-emitting diode LED1 may be connected to the second sub-electrode CE2*t* (of FIG. 3A) of the first storage capacitor Cst1 via the first via hole VH1.

The second driving transistor M21, the second switching transistor M22, and the second initialization-sensing transistor M23 of the second pixel circuit may have the same structure as the first driving transistor M11, the first switching transistor M12, and the first initialization-sensing transistor M13 described above. Likewise, the second storage capacitor Cst2 may also have the same structure as the first storage capacitor Cst1, and as shown in FIG. 3B, the second light-emitting diode LED2 may be electrically connected to the second pixel circuit via a second via hole VH2. For example, the first electrode 312 of the second light-emitting diode LED2 may be connected to a second sub-electrode of the second storage capacitor Cst2 (of FIG. 3A) via the second via hole VH2.

1-1 and 2-1 low resistance regions of a second driving semiconductor layer may be connected to the first connection member NM1 and a second sub-electrode of the second storage capacitor Cst2 (of FIG. 3A), respectively, via contact holes. 1-2 and 2-2 low resistance regions of a second switching semiconductor layer may be connected to a fifth connection member NM5 and a sixth connection member NM6, respectively, via contact holes. The fifth connection member NM5 may be connected to a first capacitor electrode of the second storage capacitor Cst2 (of FIG. 3A) via a contact hole, and the sixth connection member NM6 may be connected to the second data line DL2 via a contact hole. 1-3 and 2-3 low resistance regions of a second initialization-sensing semiconductor layer may be connected to the fourth connection member NM4 and a second sub-electrode of the second storage capacitor Cst2 (of FIG. 3A), respectively, via contact holes.

Similarly, the third driving transistor M31, the third switching transistor M32, and the third initialization-sensing transistor M33 of the third pixel circuit may have the same structure as the first driving transistor M11, the first switching transistor M12, and the first initialization-sensing transistor M13 described above. Likewise, the third storage capacitor Cst3 may also have the same structure as the first storage capacitor Cst1, and as shown in FIG. 3B, the third light-emitting diode LED3 may be electrically connected to the third pixel circuit via a third via hole VH3. For example, the first electrode 313 of the third light-emitting diode LED3 may be connected to a second sub-electrode of the third storage capacitor Cst3 (of FIG. 3A) via the third via hole VH3.

1-1 and 2-1 low resistance regions of a third driving semiconductor layer may be connected to the first connection member NM1 and a second sub-electrode of the third storage capacitor Cst3 (of FIG. 3A), respectively, via contact holes. 1-2 and 2-2 low resistance regions of a third switching semiconductor layer may be connected to a seventh connection member NM7 and an eighth connection member NM8, respectively, via contact holes. The seventh connection member NM7 may be connected to a first capacitor electrode of the third storage capacitor Cst3 (of FIG. 3A) via a contact hole, and the eighth connection member NM8 may be connected to the third data line DL3 via a contact hole. 1-3 and 2-3 low resistance regions of a third initialization-sensing semiconductor layer may be connected to the fourth connection member NM4 and a second sub-electrode of the third storage capacitor Cst3 (of FIG. 3A), respectively, via contact holes.

FIG. 3A shows a structure in which a plurality of first connection members NM1 are connected to the driving voltage line VDL. The plurality of first connection members NM1 may be spaced apart from each other in the first direction y along the driving voltage line VDL. The first portion CM1 of the plurality of first connection members NM1 may overlap the driving voltage line VDL and serve as a sub-line of the driving voltage line VDL. According to some embodiments, a first sub-line s-VDL1 may be electrically connected to the driving voltage line VDL while overlapping the driving voltage line VDL in order to reduce self-resistance of the driving voltage line VDL. According to some embodiments, the first portion CM1 may be electrically connected to the first sub-line s-VDL1 while overlapping the first sub-line s-VDL1 from above.

Similarly, a first sub-common voltage line s-VSL1 and a second sub-common voltage line s-VSL2 may be electrically connected to the common voltage line VSL while overlapping the common voltage line VSL to reduce self-resistance of the common voltage line VSL.

The second portion CM2 of the plurality of first connection members NM1 may be connected to the first driving semiconductor layer A11 of the first driving transistor M11 of the first pixel circuit, a driving semiconductor layer of the second driving transistor M21 of the second pixel circuit, and a third driving semiconductor layer of the third driving transistor M31 of the third pixel circuit, respectively, via contact holes.

The first sub-line s-VDL1 and the first sub-common voltage line s-VSL1 may be formed together during the same process as the first driving gate electrode G11 and/or the first capacitor electrode CE1 and may include the same material as each other. The first connection member NM1 and the second sub-common voltage line s-VSL2 may be arranged on the same layer as the second sub-electrode CE2*t* of the first storage capacitor Cst1.

When a drain signal is connected by overlapping a driving semiconductor layer of a driving transistor with a driving voltage line, formation of a sub-line for reducing self-resistance may be limited in an area above the driving voltage line where the driving semiconductor layer overlaps. However, according to some embodiments, because the driving voltage line VDL and the first driving semiconductor layer A11 of the first driving transistor M11 are electrically connected to each other via the first connection member NM1, the first sub-line s-VDL1 may be formed widely above the driving voltage line VDL, and accordingly, self-resistance of the driving voltage line VDL may be further reduced to improve voltage drop and heat generation.

Figure 5:
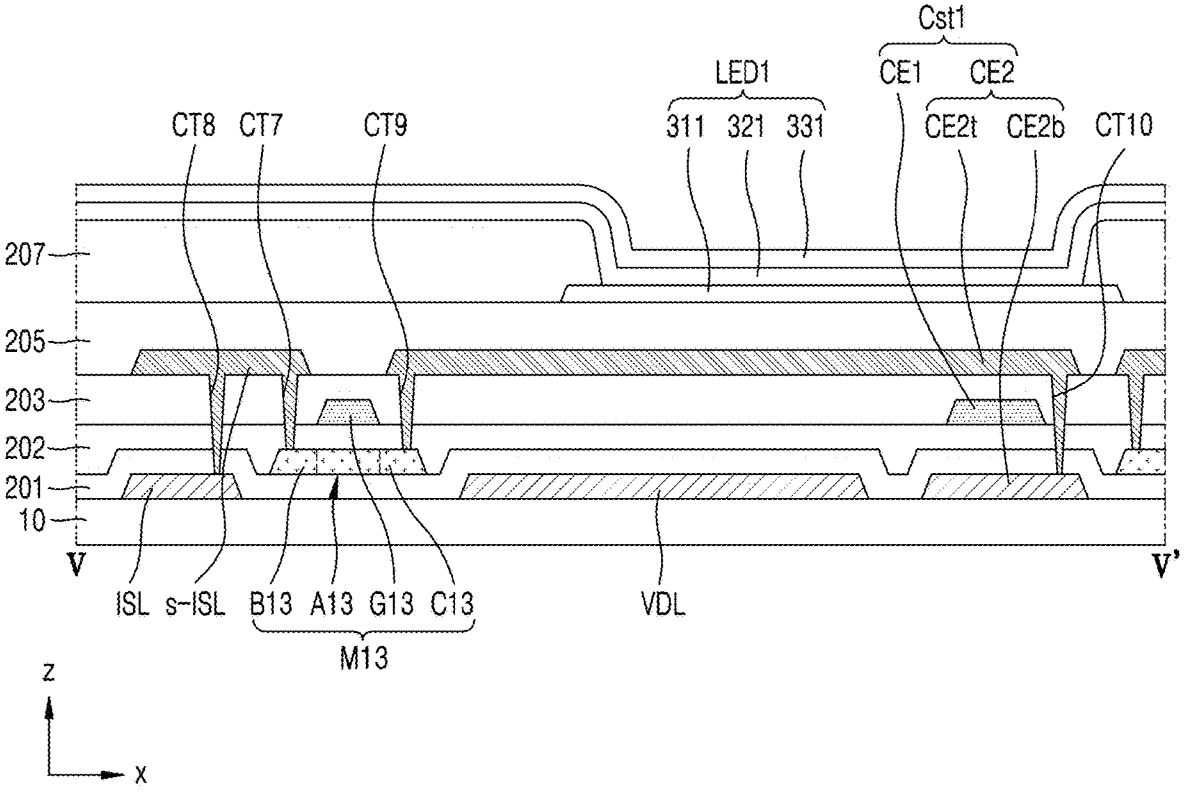
FIG. 5 is a cross-sectional view of the light-emitting panel, taken along the line V-V' of FIG. 3B.

FIG. 5 is a cross-sectional view of the light-emitting panel, taken along the line V-V' of FIG. 3B.

The first substrate 10 may include a glass material or a resin material. The glass material may include transparent glass mainly including $SiO_2$. The resin material may include polymer resin such as polyethersulfone, polyacrylate, polyetherimide, polyethylene naphthalate, polyethylene terephthalate, polyphenylene sulfide, polyarylate, polyimide, polycarbonate, cellulose triacetate, cellulose acetate propionate, etc. When the first substrate 10 includes the above-described polymer resin, the first substrate 10 may be flexible, rollable, and bendable.

The initialization sensing line ISL, the driving voltage line VDL, and the first sub-electrode CE2*b* may be arranged on the first substrate 10. The initialization sensing line ISL, the driving voltage line VDL, and the first sub-electrode CE2*b* may be arranged right on the first substrate 10 and may directly contact the first substrate 10. Alternatively, an insulating layer may be arranged between the initialization sensing line ISL, the driving voltage line VDL, and the first sub-electrode CE2*b*, and the first substrate 10. The initialization sensing line ISL, the driving voltage line VDL, and the first sub-electrode CE2*b* may include metal such as molybdenum (Mo), copper (Cu), titanium (Ti), etc.

According to some embodiments, the first to third data lines DL1 to DL3 (refer to FIG. 3A), the common voltage line VSL, and a first sub-electrode of each of the second and third storage capacitors Cst2 and Cst3 (refer to FIG. 3A) may be arranged on the same layer as the initialization sensing line ISL, the driving voltage line VDL, and the first sub-electrode CE2*b* of the first storage capacitor Cst1 shown in FIG. 5 and may include the same material as each other. The first sub-electrode CE2*b* may be arranged below the first driving transistor to serve as a shielding layer that prevents or reduces deterioration of characteristics of the driving transistor due to external light and/or an ambient electric signal.

A buffer layer 201 may be arranged on the initialization sensing line ISL, the driving voltage line VDL, and the first sub-electrode CE2*b* spaced apart from one another, and a semiconductor layer may be arranged on the buffer layer 201. In this regard, FIG. 5 shows the first initialization-sensing semiconductor layer A13 of the first initialization-sensing transistor M13 being on the buffer layer 201. According to some embodiments, semiconductor layers of other transistors may also be on the buffer layer 201 and may include the same material as each other.

The semiconductor layers may include an oxide-based semiconductor material such as IGZO. The oxide-based semiconductor material is not limited to the above-described IGZO, and may include oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), or zinc (Zn). According to some embodiments, a first initialization-sensing semiconductor layer may include a silicon-based material.

The buffer layer 201 may prevent or reduce penetration of impurities into the semiconductor layer. The buffer layer 201 may include an inorganic insulating material such as silicon nitride, silicon oxide and/or silicon oxynitride.

A gate insulating layer 202 is on the semiconductor layer. In this regard, FIG. 5 shows the gate insulating layer 202 being on the first initialization-sensing semiconductor layer A13. The gate insulating layer 202 may include an inorganic insulating material such as silicon nitride, silicon oxide and/or silicon oxynitride, or may include an organic insulating material. The gate insulating layer 202 may include a single-layer or multi-layer structure of the above-described material.

A gate electrode may overlap a channel region of a corresponding semiconductor layer with the gate insulating layer 202 therebetween. In this regard, FIG. 5 shows the first initialization-sensing gate electrode G13 overlapping a channel region of the first initialization-sensing semiconductor layer A13 with the gate insulating layer 202 therebetween. The first initialization-sensing semiconductor layer A13 may include a channel region overlapping the first initialization-sensing gate electrode G13 and the 1-3 and 2-3 low resistance regions B13 and C13 arranged on both sides of the channel region. The first initialization-sensing gate electrode G13 may include molybdenum (Mo), copper (Cu), titanium (Ti), etc. and may include a single-layer or multi-layer structure including the above-described material.

An interlayer insulating layer 203 may be on the gate electrode. In this regard, FIG. 5 shows the interlayer insulating layer 203 on the first capacitor electrode CE1 of the first storage capacitor Cst1 and the first initialization-sensing gate electrode G13. The first capacitor electrode CE1 may be integral (or integrally formed, e.g., as a cohesive integral material or layer) with a first driving gate electrode of a first driving transistor. The interlayer insulating layer 203 may include an inorganic insulating material such as silicon nitride, silicon oxide and/or silicon oxynitride, or may include an organic insulating material.

In addition, the second sub-electrode CE2*t* and a first sub-initialization sensing line s-ISL may be arranged on the interlayer insulating layer 203. The first sub-initialization sensing line s-ISL may correspond to the fourth connection member NM4 (of FIG. 3A). The first sub-initialization sensing line s-ISL may be electrically connected to the initialization sensing line ISL via a contact hole penetrating the interlayer insulating layer 203. For example, the first sub-initialization sensing line s-ISL may be electrically connected to the initialization sensing line ISL via the eighth contact hole CT8 penetrating the buffer layer 201, the gate insulating layer 202, and the interlayer insulating layer 203, and a portion of the first sub-initialization sensing line s-ISL may be electrically connected to a sensing semiconductor layer via the seventh contact hole CT7 penetrating the gate insulating layer 202 and the interlayer insulating layer 203. In this regard, the first sub-initialization sensing line s-ISL is connected to the 1-3 low resistance region B13 of the first initialization-sensing semiconductor layer A13 via the seventh contact hole CT7. The 2-3 low resistance region C13 of the first initialization-sensing semiconductor layer A13 may be electrically connected to the second sub-electrode CE2*t* of the second capacitor electrode CE2 via the ninth contact hole CT9.

The scan line SL, the control line CL, the auxiliary line AL, the second sub-electrode CE2*t* of the second capacitor electrode CE2, and the first to eighth connection members NM1 to NM8 on the interlayer insulating layer 203 may be arranged on the same layer as each other and may include the same material as each other.

A via insulating layer 205 may be arranged on the second sub-electrode CE2*t*. The via insulating layer 205 may include an organic insulating material and/or an inorganic insulating material. The organic insulating material may include, for example, a general commercial polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A first electrode of a light-emitting diode may be arranged on the via insulating layer 205. In this regard, FIG. 5 shows the first electrode 311 of the first light-emitting diode LED1 arranged on the via insulating layer 205.

A bank layer 207 having an opening exposing a portion of the first electrode 311 may be arranged on the first electrode 311, and an emission layer 321 and a second electrode 331 may overlap the first electrode 311 via the opening of the bank layer 207. The first electrode 311 may include transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

According to some embodiments, the first electrode 311 may include a reflective film including magnesium (Mg), silver (Ag), aluminum (Al), platinum (Pt), palladium (Pd), gold (Au), nickel (Ni), neodymium (Nd), iridium (Ir), chromium (Cr), or a compound thereof. According to some embodiments, the first electrode 311 may further include a film on/under the above-described reflective film and including ITO, IZO, ZnO, or $In_2O_3$. According to some embodiments, the first electrode 311 may have a three-layer structure of an ITO layer, an Ag layer, and an ITO layer. Although FIG. 5 illustrates the first electrode 311 of the first light-emitting diode LED1, the first electrodes 312 and 313 of the second and third light-emitting diodes LED2 and LED3 may be arranged on the same layer as the first electrode 311 of the first light-emitting diode LED1 and may include the same material as each other.

The emission layer 321 may include a polymer organic material or low-molecular weight organic material emitting blue light. The emission layer 321 may entirely cover the first substrate 10. For example, the emission layer 321 may be formed as one body to entirely cover the first to third light-emitting diodes LED1 to LED3 (of FIG. 3B) described above with reference to FIG. 3B. The second electrode 331 may also entirely cover the first substrate 10.

The second electrode 331 may be a semi-transmissive or transmissive electrode. The second electrode 331 may be a semi-transmissive electrode including ultra-thin metal including magnesium (Mg), silver (Ag), aluminum (Al), platinum (Pt), palladium (Pd), gold (Au), nickel (Ni), neodymium (Nd), iridium (Ir), chromium (Cr), or a compound thereof. The second electrode 331 may include transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

Figure 6:
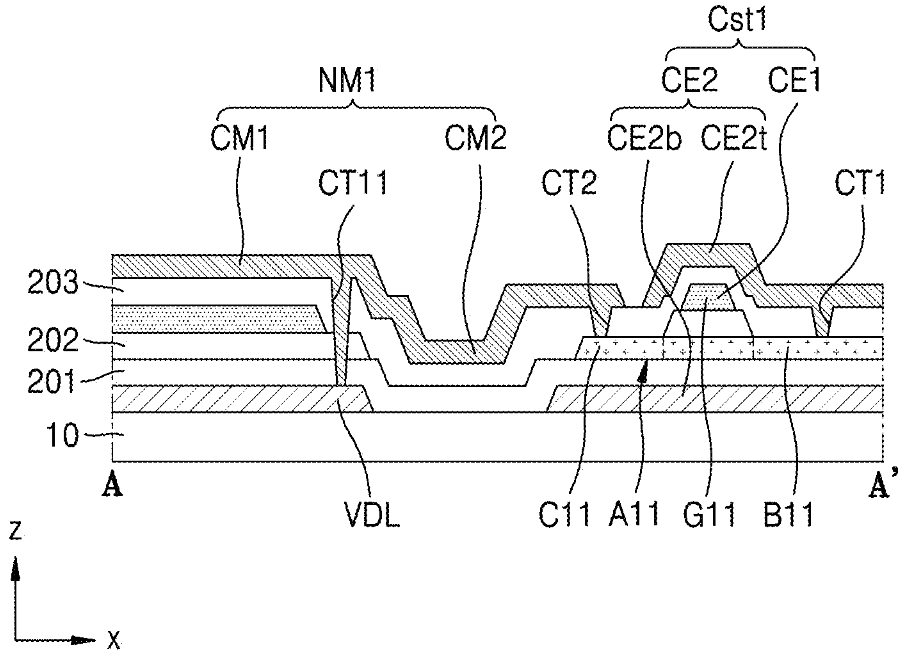
FIG. 6 is a cross-sectional view of the light-emitting panel, taken along the line A-A' of FIG. 4.

FIG. 6 is a cross-sectional view of the light-emitting panel, taken along the line A-A' of FIG. 4.

Referring to FIG. 6, the driving voltage line VDL and the first sub-electrode CE2*b* corresponding to a conductive layer spaced apart from the driving voltage line VDL may be arranged on the first substrate 10. The buffer layer 201 may cover the driving voltage line VDL and the first sub-electrode CE2*b*, and the first driving semiconductor layer A11 of the first driving transistor M11 insulated from the first sub-electrode CE2*b* by the buffer layer 201 and overlapping the first sub-electrode CE2*b* may be arranged on the buffer layer 201.

Referring to FIG. 6, the driving voltage line VDL and/or the first sub-electrode CE2*b* is arranged under the buffer layer 201, and thus, the buffer layer 201 may have a step or a slope portion corresponding to a side surface of the driving voltage line VDL and/or the first sub-electrode CE2*b*. In this case, foreign materials generated during a process of forming the buffer layer 201 or subsequent processes may be concentrated on the slope portion.

When the first driving semiconductor layer A11 of a driving transistor is extended to an upper portion of the driving voltage line VDL and connected to the driving voltage line VDL, a semiconductor layer of the driving transistor may be formed on a slope portion of the driving voltage line VDL and/or the first sub-electrode CE2*b*. In this case, a short circuit between a driving semiconductor layer and other signal lines may occur on an upper portion of the slope portion due to foreign materials arranged on the slope portion, and accordingly, bright spot defects may occur.

According to one or more embodiments, the driving voltage line VDL and the first driving semiconductor layer A11 of the first driving transistor M11 may be electrically connected to each other via the first connection member NM1, and the first driving semiconductor layer A11 may be arranged inside the first sub-electrode CE2*b* in a plan view. For example, an edge of the first driving semiconductor layer A11 may be in contact with or arranged inside an edge of the first sub-electrode CE2*b* in a plan view. Thus, because the first driving semiconductor layer A11 is not formed on an upper portion of the slope portion of the first sub-electrode CE2*b*, the occurrence of a short circuit between a semiconductor layer and other signal lines due to foreign materials on the slope portion may be prevented or reduced. Accordingly, the occurrence of early bright spot and progressive bright spot defects may be prevented or reduced.

The first capacitor electrode CE1 may overlap the first sub-electrode CE2*b* below. The first capacitor electrode CE1 of the first storage capacitor Cst1 may be integral (or integrally formed, e.g., as a cohesive integral material or layer) with the first driving gate electrode G11 of the first driving transistor M11.

Referring to FIG. 6, the first driving gate electrode G11 may overlap the first driving semiconductor layer A11 with the gate insulating layer 202 under the first driving gate electrode G11 therebetween. A region of the first driving semiconductor layer A11 overlapping the first driving gate electrode G11 may be a first driving channel region, a side of the first driving channel region overlapping the first connection member NM1 may be the 2-1 low resistance region C11, and the opposite side may correspond to the 1-1 low resistance region B11.

The second sub-electrode CE2*t* may overlap the first sub-electrode CE2*b* and may be connected to the first sub-electrode CE2*b* via a contact hole formed in the interlayer insulating layer 203. The first sub-electrode CE2*b* and the second sub-electrode CE2*t* may have the same voltage level.

The 1-1 low resistance region B11 of the first driving semiconductor layer A11 may be connected to a portion of the second sub-electrode CE2*t* via the first contact hole CT1 formed in the interlayer insulating layer 203, and the 2-1 low resistance region C11 of the first driving semiconductor layer A11 may be connected to the first connection member NM1 via the second contact hole CT2 formed in the interlayer insulating layer 203. The first connection member NM1 may be connected to the driving voltage line VDL via the eleventh contact hole CT11 formed in the interlayer insulating layer 203, the gate insulating layer 202, and the buffer layer 201 and thus may have the same voltage level as the driving voltage line VDL.

Figure 7:
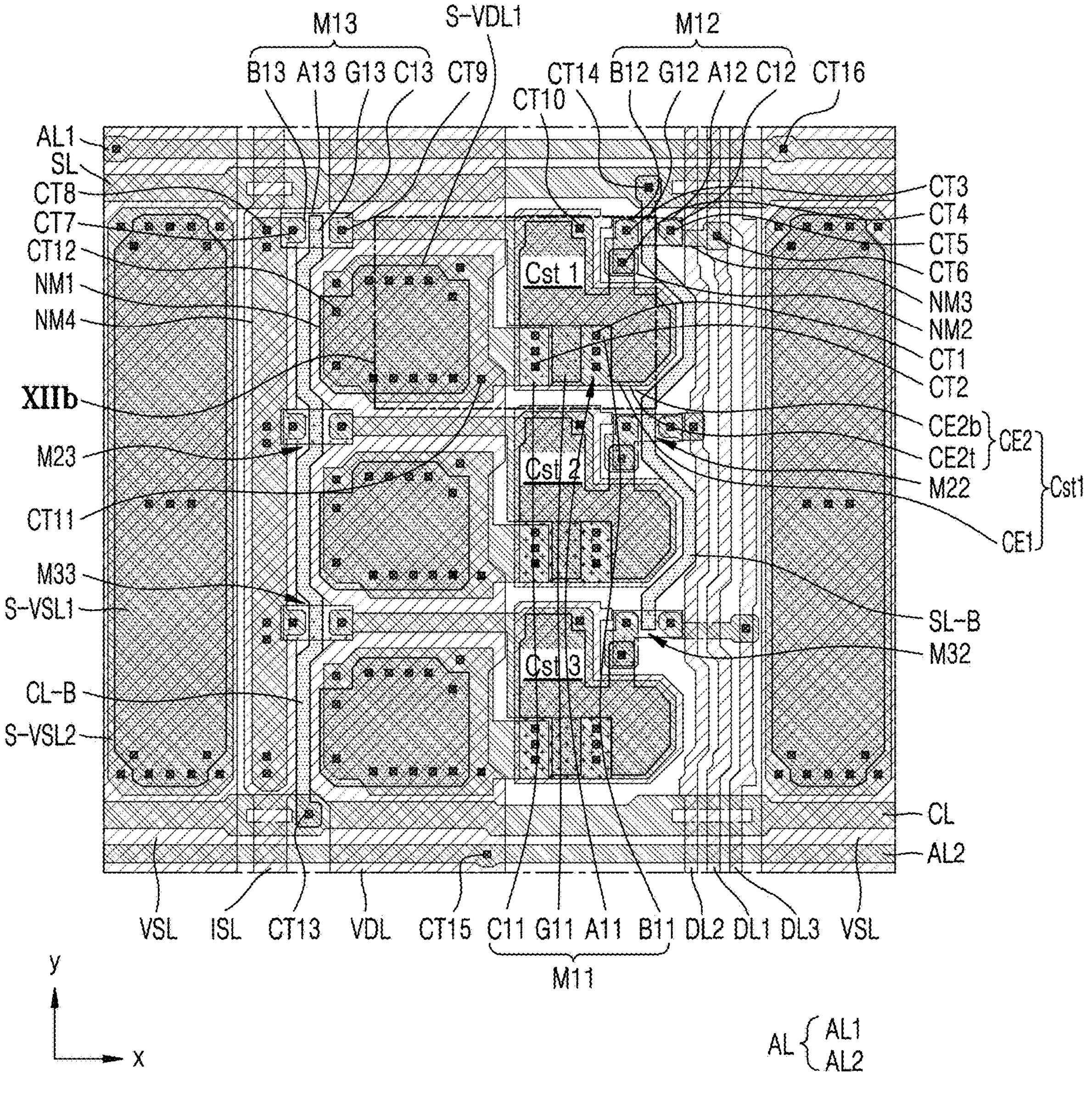
FIG. 7 is a plan view showing pixel circuits of a light-emitting panel of a display apparatus according to some embodiments.
Figure 8:
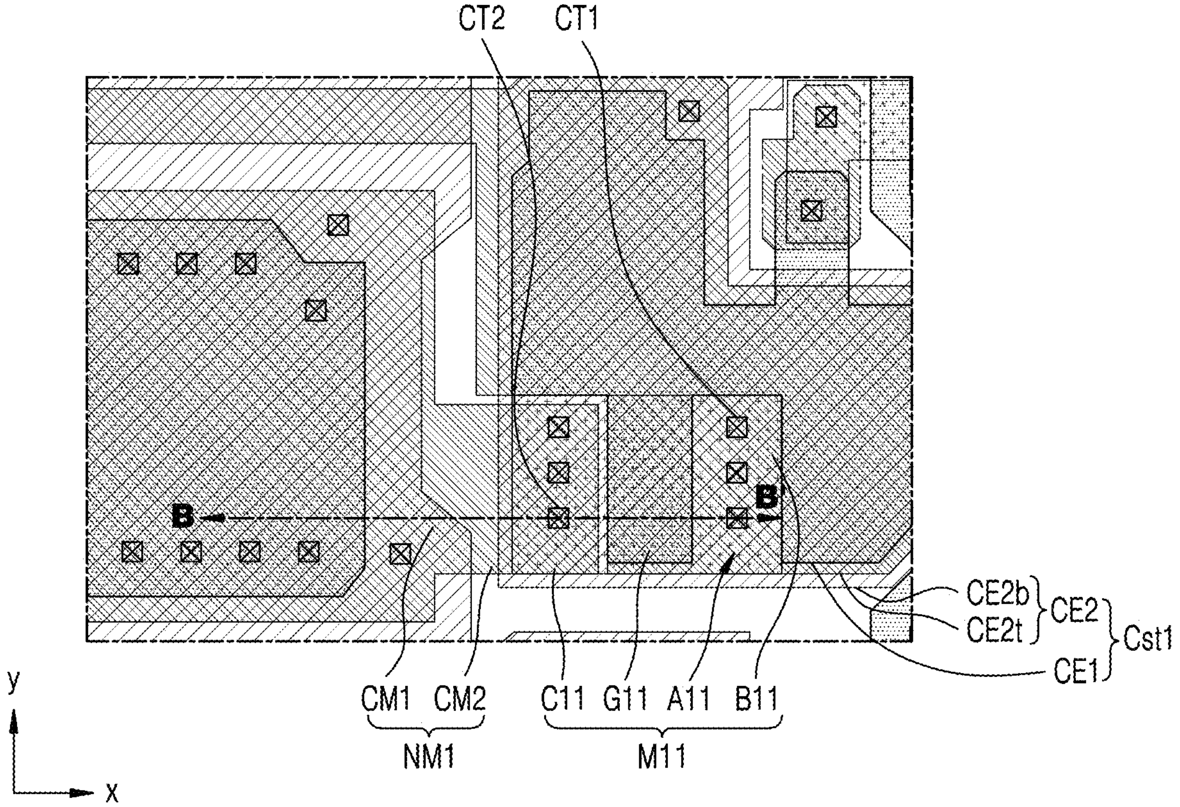
FIG. 8 is an enlarged plan view of the region XIIb of FIG. 7.
Figure 9:
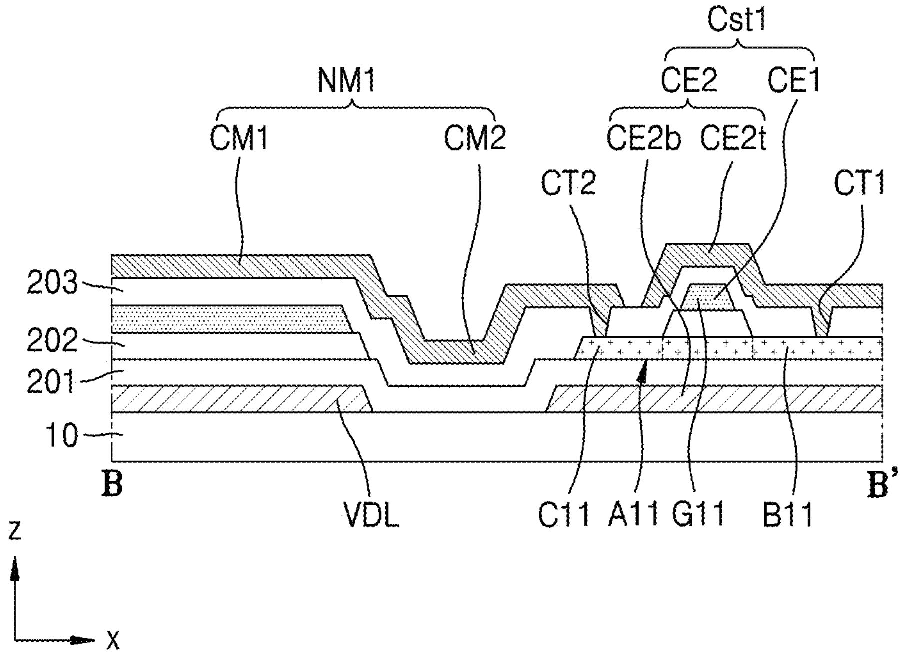
FIG. 9 is a cross-sectional view of the light-emitting panel, taken along the line B-B' of FIG. 8.

FIG. 7 is a plan view showing pixel circuits of a light-emitting panel according to some embodiments. FIG. 8 is an enlarged plan view of the region XIIb of FIG. 7. FIG. 9 is a cross-sectional view of the light-emitting panel, taken along the line B-B' of FIG. 8. In FIGS. 7 to 9, the same reference numerals as those in FIGS. 3A to 6 denote the same elements, and thus, a repeated description thereof is omitted below.

Referring to FIGS. 7 to 9, the first driving gate electrode G11 may have a shape protruding from the first capacitor electrode CE1 in the first direction y. The protruding portion may overlap a first channel region of a first driving semiconductor layer, a right side of the first driving channel region may be the 1-1 low resistance region B11, and a left side of the first driving channel region may correspond to the 2-1 low resistance region C11.

Lengths of the second portion CM2 of the first connection member NM1 in the first direction y and the second direction x may vary depending on shapes of the first driving gate electrode G11 and the 2-1 low resistance region C11. A length of the second portion CM2 in the second direction x may be greater than a length of the 2-1 low resistance region C11 in the second direction x, and a length of the second portion CM2 in the first direction y may be greater than a protruding length of the first driving gate electrode G11 in the first direction y.

Referring to FIG. 9, the driving voltage line VDL and the first sub-electrode CE2*b* spaced apart from the driving voltage line VDL may be arranged on the first substrate 10. The buffer layer 201 may cover the driving voltage line VDL and the first sub-electrode CE2*b*, and the first driving semiconductor layer A11 of the first driving transistor M11 insulated from the first sub-electrode CE2*b* by the buffer layer 201 and overlapping the first sub-electrode CE2*b* may be arranged on the buffer layer 201. The gate insulating layer 202 may be arranged on the first driving semiconductor layer A11, and the first driving gate electrode G11 may be on the gate insulating layer 202. The interlayer insulating layer 203 may be on the first driving gate electrode G11. The first connection member NM1 and the second sub-electrode CE2*t* may be arranged on the interlayer insulating layer 203.

The driving voltage line VDL and the first driving semiconductor layer A11 may be electrically connected to each other via the first connection member NM1. The second portion CM2 of the first connection member NM1 may be connected to the 2-1 low resistance region C11 of the first driving semiconductor layer A11 via the second contact hole CT2 formed in the interlayer insulating layer 203. The first driving semiconductor layer A11 may be arranged inside the first sub-electrode CE2*b* in a plan view. For example, an edge of the first driving semiconductor layer A11 may be in contact with or arranged inside an edge of the first sub-electrode CE2*b* in a plan view. Thus, because the first driving semiconductor layer A11 is not formed on an upper portion of the slope portion of the first sub-electrode CE2*b*, the occurrence of a short circuit between a semiconductor layer and other signal wirings due to foreign materials on the slope portion may be prevented or reduced. Accordingly, the occurrence of early bright spot and progressive bright spot defects may be prevented or reduced.

Figure 10:
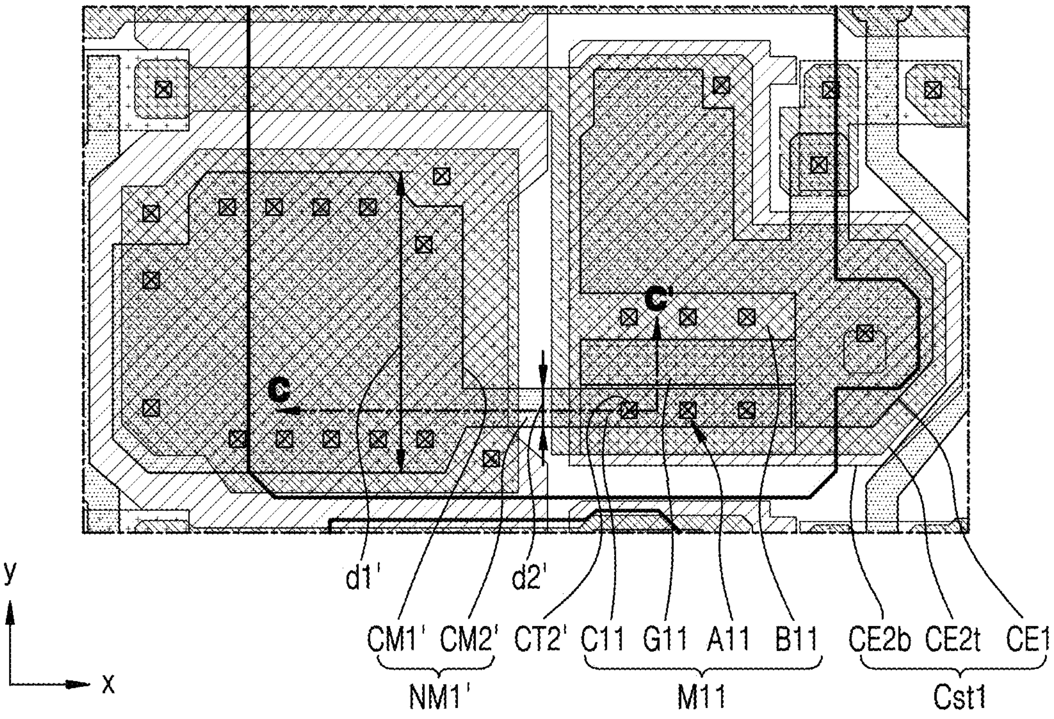
FIG. 10 is a plan view showing pixel circuits of a light-emitting panel of a display apparatus according to some embodiments.
Figure 11:
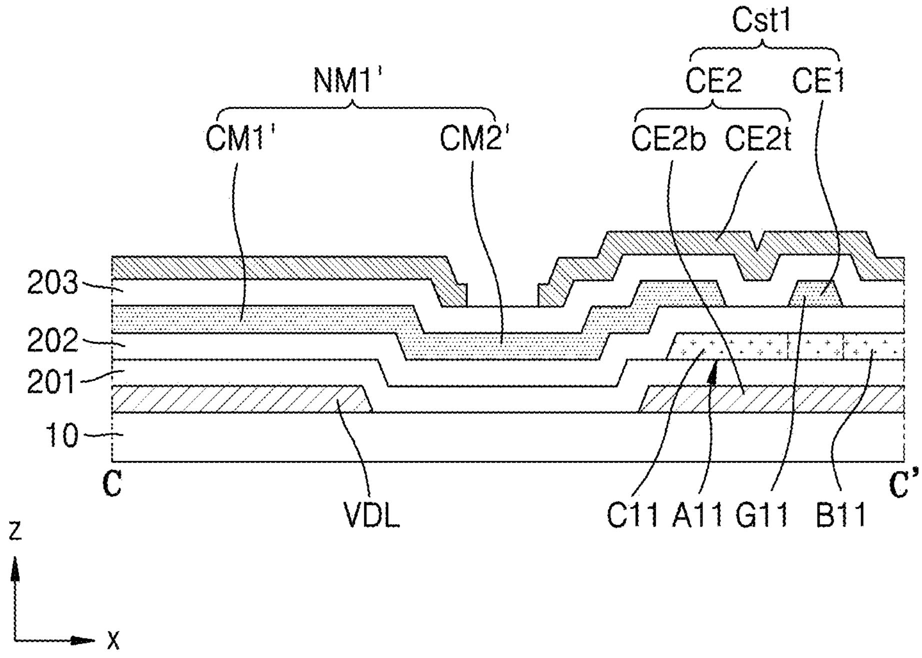
FIG. 11 is a cross-sectional view of the light-emitting panel, taken along the line C-C' of FIG. 10.

FIG. 10 is a plan view showing pixel circuits of a light-emitting panel of a display apparatus according to some embodiments. FIG. 11 is a cross-sectional view of the light-emitting panel, taken along the line C-C' of FIG. 10. In FIGS. 10 and 11, the same reference numerals as those in FIGS. 3A to 6 denote the same elements, and thus, a repeated description thereof is omitted below.

FIGS. 10 and 11 show a first connection member NM1' electrically connecting the driving voltage line VDL and the semiconductor layer A11 of a first driving transistor. The first connection member NM1' may be arranged above the driving voltage line VDL and may include a first portion CM1' overlapping the driving voltage line VDL and a second portion CM2' protruding from the first portion CM1'. A length d1' of the first portion CM1' in the first direction y may be greater than a length d2' of the second portion CM2' in the first direction y. Unlike FIGS. 3A to 6, the first connection member NM1' shown in FIGS. 10 and 11 may be formed by the same process as the first capacitor electrode CE1 and the first driving gate electrode G11 and may include the same material as the first capacitor electrode CE1 and the first driving gate electrode G11.

The first portion CM1' of the first connection member NM1' may overlap the driving voltage line VDL and serve as a sub-line of the driving voltage line VDL. The first portion CM1' may be electrically connected to the driving voltage line VDL while overlapping the driving voltage line VDL from above. A second sub-line for reducing self-resistance of the driving voltage line VDL may be further provided above the first connection member NM1'. The second sub-line may be electrically connected to the first connection member NM1' while overlapping the first connection member NM1' from above. The second sub-line may be arranged on the same layer as the second sub-electrode CE2*t* of the first storage capacitor Cst1.

The second portion CM2' of the first connection member NM1' may be arranged on the gate insulating layer 202, and in this regard, the gate insulating layer 202 may cover the buffer layer 201 and the first driving semiconductor layer A11. The second portion CM2' may be connected to the 2-1 low resistance region C11 of the first driving semiconductor layer A11 via a contact hole formed in the gate insulating layer 202.

In a display apparatus according to one or more embodiments, instances of a short circuit occurring between source/drain signal lines may be prevented or reduced and instances of bright spots occurring may be prevented or reduced by arranging a semiconductor layer of a driving transistor so as not to deviate from a lower conductive layer. However, embodiments according to the present disclosure are not limited by such characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:

a substrate;

a driving voltage line disposed on the substrate and extending in a first direction;

a first conductive layer disposed on a same layer as the driving voltage line and spaced apart from the driving voltage line;

a first insulating layer covering the driving voltage line and the first conductive layer;

a driving transistor disposed on the first insulating layer and comprising a driving gate electrode and a driving semiconductor layer overlapping the first conductive layer; and a connection member electrically connecting the driving voltage line and the driving semiconductor layer to each other, and extending continuously along a second direction crossing the first direction to overlap the driving voltage line and the driving semiconductor layer in a plan view, wherein an edge of the driving semiconductor layer is in contact with or inside an edge of the first conductive layer in the plan view.

2. The display apparatus of claim 1, further comprising a capacitor electrically connected to the driving transistor, wherein the capacitor comprises a first capacitor electrode, a second capacitor electrode disposed above the first capacitor electrode and overlapping the first capacitor electrode, and a third capacitor electrode disposed below the first capacitor electrode and overlapping the first capacitor electrode, wherein the third capacitor electrode is the first conductive layer.

3. The display apparatus of claim 2, wherein the connection member is on a same layer as the second capacitor electrode.

4. The display apparatus of claim 2, wherein the first capacitor electrode is integrally formed with the driving gate electrode.

5. The display apparatus of claim 2, wherein the first conductive layer is connected to the second capacitor electrode via a contact hole.

6. The display apparatus of claim 1, wherein the connection member is disposed above the driving voltage line and comprises a first portion overlapping the driving voltage line and a second portion protruding from the first portion, wherein a first length of the first portion in the first direction is greater than a second length of the second portion in the first direction.

7. The display apparatus of claim 1, further comprising a sub-line disposed above the driving voltage line and overlapping the driving voltage line, wherein the connection member is disposed above the driving voltage line and the sub-line and comprises a first portion overlapping the driving voltage line and a second portion protruding from the first portion, wherein a first length of the first portion in the first direction is greater than a second length of the second portion in the first direction.

8. The display apparatus of claim 1, wherein the connection member is connected to the driving voltage line via a contact hole.

9. The display apparatus of claim 1, wherein the driving gate electrode comprises a shape protruding in the first direction or the second direction along a channel region of the driving semiconductor layer in a plan view.

10. A display apparatus comprising:

a substrate;

adjacent common voltage lines spaced apart from each other on the substrate and extending in a first direction;

a driving voltage line disposed between the adjacent common voltage lines and extending in the first direction;

adjacent auxiliary lines electrically connected to the adjacent common voltage lines or the driving voltage line, spaced apart from each other, and extending in a second direction crossing the first direction; and a plurality of pixel circuits in an area surrounded by the adjacent common voltage lines and the adjacent auxiliary lines in a plan view, wherein a first pixel circuit from among the plurality of pixel circuits comprises:

a first conductive layer disposed on a same layer as the driving voltage line and spaced apart from the driving voltage line;

a first driving transistor insulated from the first conductive layer and comprising a first driving gate electrode and a first driving semiconductor layer overlapping the first conductive layer; and a connection member electrically connecting the driving voltage line and the first driving semiconductor layer to each other, and extending continuously along the second direction crossing the first direction to overlap the driving voltage line and the driving semiconductor layer in a plan view, wherein an edge of the first driving semiconductor layer is in contact with or inside an edge of the first conductive layer in a plan view.

11. The display apparatus of claim 10, further comprising a data line disposed between the adjacent common voltage lines and extending in the first direction, wherein the first pixel circuit further comprises a first switching transistor electrically connected to the first driving transistor and the data line.

12. The display apparatus of claim 10, further comprising a sensing line disposed between the adjacent common voltage lines and extending in the first direction, wherein the first pixel circuit further comprises a first sensing transistor electrically connected to the first driving transistor and the sensing line.

13. The display apparatus of claim 10, further comprising a capacitor electrically connected to the first driving transistor, wherein the capacitor comprises a first capacitor electrode, a second capacitor electrode disposed above the first capacitor electrode and overlapping the first capacitor electrode, and a third capacitor electrode disposed below the first capacitor electrode and overlapping the first capacitor electrode, wherein the third capacitor electrode is the first conductive layer.

14. The display apparatus of claim 13, wherein the connection member is on a same layer as the second capacitor electrode.

15. The display apparatus of claim 13, wherein the first capacitor electrode is integrally formed with the first driving gate electrode.

16. The display apparatus of claim 13, wherein the first conductive layer is connected to the second capacitor electrode via a contact hole.

17. The display apparatus of claim 10, wherein the connection member is disposed above the driving voltage line and comprises a first portion overlapping the driving voltage line and a second portion protruding from the first portion, wherein a first length of the first portion in the first direction is greater than a second length of the second portion in the first direction.

18. The display apparatus of claim 10, further comprising a sub-line disposed above the driving voltage line and overlapping the driving voltage line, wherein the connection member is disposed above the driving voltage line and the sub-line and comprises a first portion overlapping the driving voltage line and a second portion protruding from the first portion, wherein a first length of the first portion in the first direction is greater than a second length of the second portion in the first direction.

19. The display apparatus of claim 10, wherein the connection member is connected to the driving voltage line via a contact hole.

* * * * *